United States Patent
Li et al.

(10) Patent No.: US 12,288,965 B1
(45) Date of Patent: Apr. 29, 2025

(54) VERTICAL CAVITY SURFACE EMITTING LASER STRUCTURE AND MANUFACTURING METHOD THEREOF

(71) Applicant: Shenzhen Technology University, Shenzhen (CN)

(72) Inventors: Hui Li, Shenzhen (CN); Jian Feng, Shenzhen (CN); Chuyu Zhong, Shenzhen (CN); Shupeng Deng, Shenzhen (CN); Shihao Ding, Shenzhen (CN); Nannan Li, Shenzhen (CN); Jinlong Lu, Shenzhen (CN); Wanxian Xu, Shenzhen (CN); Zhenhuan Qiu, Shenzhen (CN); Shaochi Pan, Shenzhen (CN); Cunzheng Ning, Shenzhen (CN)

(73) Assignee: Shenzhen Technology University, Shenzhen (CN)

( * ) Notice: Subject to any disclaimer, the term of this patent is extended or adjusted under 35 U.S.C. 154(b) by 0 days.

(21) Appl. No.: 19/007,848

(22) Filed: Jan. 2, 2025

(30) Foreign Application Priority Data

May 29, 2024 (CN) .................. 202410675555.X

(51) Int. Cl.
*H01S 5/183* (2006.01)
*H01S 5/042* (2006.01)
(Continued)

(52) U.S. Cl.
CPC ...... *H01S 5/18344* (2013.01); *H01S 5/04256* (2019.08); *H01S 5/18361* (2013.01); *H01S 5/2275* (2013.01); *H01S 5/3095* (2013.01)

(58) Field of Classification Search
CPC ............. H01S 5/18344; H01S 5/04256; H01S 5/18361; H01S 5/2275; H01S 5/3095
See application file for complete search history.

(56) References Cited

U.S. PATENT DOCUMENTS

| 2003/0081642 A1 | 5/2003 | Hwang |
| 2003/0162315 A1* | 8/2003 | Kapon ............... H01S 5/18308 438/22 |

(Continued)

FOREIGN PATENT DOCUMENTS

| CN | 1714485 A | 12/2005 |
| CN | 115021078 A | 9/2022 |
| JP | 2020188206 A | 11/2020 |

OTHER PUBLICATIONS

First search report dated Jul. 1, 2024 in SIPO application No. 202410675555.X.

(Continued)

*Primary Examiner* — Yuanda Zhang
(74) *Attorney, Agent, or Firm* — Pilloff Passino & Cosenza LLP; Rachel Pilloff; Sean Passino

(57) ABSTRACT

Provided are a new vertical cavity surface emitting laser structure and a manufacturing method thereof. The structure includes a substrate layer, a lower N-type DBR, an active region, an upper N-type DBR and a mixed dielectric DBR sequentially arranged from bottom to top, where a second-class tunnel junction is arranged on one side of the active region close to the upper N-type DBR, where the second-class tunnel junction is embedded in a bottom of the upper N-type DBR and surrounded by the upper N-type DBR, and the substrate layer, the lower N-type DBR, the active region, the upper N-type DBR, the mixed dielectric DBR and the second-class tunnel junction are all coaxial elliptical cylinders; negative electrodes are arranged on the lower N-type DBR, and positive electrodes are arranged on the upper N-type DBRs substrate layer.

6 Claims, 4 Drawing Sheets

(51) Int. Cl.
   *H01S 5/227*   (2006.01)
   *H01S 5/30*    (2006.01)

(56) References Cited

U.S. PATENT DOCUMENTS

2004/0096996 A1    5/2004  Cheng
2021/0367407 A1*  11/2021  Yang .................. H01S 5/18358
2024/0072517 A1*   2/2024  Li ........................ H01S 5/3013
2024/0380173 A1*  11/2024  Takeuchi ............... H01S 5/183

OTHER PUBLICATIONS

Notification to Grant Patent Right for Invention dated Jul. 23, 2024 in SIPO application No. 202410675555.X.
First Office action dated Jul. 2, 2024 in SIPO application No. 202410675555.X.
Second search report dated Jul. 17, 2024 in SIPO application No. 202410675555.X.

* cited by examiner

VERTICAL CAVITY SURFACE EMITTING LASER STRUCTURE AND MANUFACTURING METHOD THEREOF

CROSS-REFERENCE TO RELATED APPLICATIONS

This application claims priority to Chinese Patent Application No. 202410675555.X, filed on May 29, 2024, the contents of which are hereby incorporated by reference.

TECHNICAL FIELD

The disclosure belongs to the technical field of semiconductor lasers, and in particular to a new vertical cavity surface emitting laser structure and a manufacturing method thereof.

BACKGROUND

Vertical cavity surface emitting laser (VCSEL) is a kind of semiconductor laser with light emitting direction perpendicular to the surface of the chip. Since VCSEL was put forward in the 1970s, after continuous optimization and development, it has developed with excellent properties such as small size, high energy efficiency, low cost, circular symmetric spot and easy realization of two-dimensional array integration. At present, the main application fields of VCSEL include optical fiber communication, data center, Gigabit Ethernet, sensing and face recognition.

However, the conventional VCSEL has many limitations. Conventional VCSEL adopts multi-layer P-type and N-type mirrors, a circular or square mesa with the oxidation limiting layer and single layer. The problems of this method are high free carrier absorption in the p-doped layer of the laser and uneven current injection caused by poor mobility of the p-type layer, which imposes a limitation on the thermal optimization of the device and a poor thermal environment of the mesa. The modulation bandwidth of this method is relatively low, and the reliability and carrier recombination efficiency need to be improved. At present, the main strategy to increase the bandwidth is to reduce the oxide aperture. However, it is challenging to realize the oxide aperture with a diameter less than 3 microns, and high reliability and repeatability are required in mass production, and the oxidation limiting layer also limits the thermal optimization ability of the device.

SUMMARY

In order to solve the above technical problems, the disclosure provides a new vertical cavity surface emitting laser structure and a manufacturing method thereof, aiming at obtaining the high modulation bandwidth, improving the current injection efficiency, improving the reliability, repeatability, output power, carrier recombination efficiency, heat dissipation performance and mode stability of the laser and optimizing the performance of the laser by using a photo-etched aperture structure of a second-class tunnel junction and epitaxially growing an upper N-type distributed Bragg reflector (DBR), intra-cavity asymmetric electrodes of elliptical multi mesas and a dielectric DBR with few logarithm after photoetching the second-class tunnel junction into an elliptical aperture.

In order to achieve the above objectives, the disclosure provides a new vertical cavity surface emitting laser structure, including:

a substrate layer, a lower N-type DBR, an active region, an upper N-type DBR and a mixed dielectric DBR sequentially arranged from bottom to top, where a second-class tunnel junction is arranged on one side of the active region close to the upper N-type DBR, where the second-class tunnel junction is embedded in a bottom of the upper N-type DBR and surrounded by the upper N-type DBR, and the substrate layer, the lower N-type DBR, the active region, the upper N-type DBR, the mixed dielectric DBR and the second-class tunnel junction are all coaxial elliptical cylinders; negative electrodes are arranged on the lower N-type DBR, and positive electrodes are arranged on the upper N-type DBR.

Optionally, mesa shapes of the substrate layer and the lower N-type DBR are same to form a first elliptical cylinder; mesa shapes of the active region and the upper N-type DBR are same to form a second elliptical cylinder; the mixed dielectric DBR is used as a third elliptical cylinder, where proportions of major and minor axes of the first elliptical cylinder, the second elliptical cylinder and the third elliptical cylinder are same, and mesa areas are reduced in turn; the negative electrodes are symmetrically arranged at both ends of a major axis of a top mesa of the first elliptical cylinder, and the positive electrodes are symmetrically arranged at both ends of a minor axis of a top mesa of the second elliptical cylinder.

Optionally, the mixed dielectric DBR includes first DBRs and second DBRs provided in alternating stacks, where a refractive index of the first DBRs is smaller than a refractive index of the second DBRs, and the first DBRs and the second DBRs each have an optical thickness of a quarter of a target wavelength, and the second DBRs and the first DBRs respectively use oxide $TiO_2$ and nitride $Si_3N_4$, where one of the second DBRs are arranged in contact with the upper N-type DBR.

Optionally, the second-class tunnel junction includes an N-type highly doped layer and a P-type highly doped layer sequentially arranged, where the N-type highly doped layer is arranged in contact with the active region.

Optionally, a semiconductor material of the N-type highly doped layer uses a doped material of aluminum, gallium, arsenic and antimony.

Optionally, a semiconductor material of the P-type highly doped layer uses a doped material of indium, gallium, arsenic and phosphorus.

In order to better achieve the above technical objectives, the disclosure also provides a manufacturing method of the new vertical cavity surface emitting laser structure, including following steps:

S1, epitaxially growing the lower N-type DBR, the active region and the second-class tunnel junction on the substrate layer from bottom to top by methods of molecular beam epitaxy and metal organic chemical vapor deposition;

S2, etching the substrate layer and the lower N-type DBR into the elliptical cylinders with the same mesa shape to form the first elliptical cylinder, and etching the second-class tunnel junction into the elliptical cylinder;

S3, filling regions on both sides of the second-class tunnel junction with an N-type DBR. and epitaxially growing the upper N-type DBR and the mixed dielectric on the second-class tunnel junction in turn;

S4, etching the active region and the upper N-type DBR into the elliptical cylinders with the same mesa shape by dry etching to form the second elliptical cylinder;

S5, etching the mixed dielectric DBR into the elliptical cylinder as the third elliptical cylinder;

where the proportions of the major and minor axes of the first elliptical cylinder, the second elliptical cylinder and the third elliptical cylinder are the same, and the mesa areas are reduced in turn; and S6, depositing the negative electrodes at both ends of the major axis of the top mesa of the first elliptical cylinder, and depositing the positive electrodes at both ends of the minor axis of the top mesa of the second elliptical cylinder.

Compared with the prior art, the disclosure has following advantages and technical effects.

The disclosure provides a new vertical cavity surface emitting laser structure. The difference between this structure and the conventional VCSEL is that in the disclosure, a second-class tunnel junction is epitaxially grown and then photoetched into an elliptical aperture, and then an upper N-type DBR is epitaxially grown and is combined with intra-cavity asymmetric electrodes of elliptical multi mesas and a mixed dielectric DBR for the VCSEL structure. The elliptical second-class tunnel junction may effectively realize the current limitation and optical field limitation of the device and improve the heat dissipation performance and output stability of the device. The second-class tunnel junction is epitaxially grown and then photoetched to avoid a wet oxidation process and optimize the reliability and high modulation bandwidth performance of the device. The upper N-type DBR is epitaxially grown after photoetching the second-class tunnel junction, so as to improve the luminous efficiency of the device. By combining the design of the intra-cavity electrodes of elliptical multi mesas and using asymmetric current injection, the heat dissipation capacity, carrier recombination efficiency and mode stability of the device are improved. High reflectivity, reduced device longitudinal size and improved optical feedback efficiency and improved output power of the device are achieved by the mixed dielectric DBR consisting of $TiO_2/Si_3N_4$ materials with high and low refractive indexes.

BRIEF DESCRIPTION OF THE DRAWINGS

The accompanying drawings, which constitute a part of the disclosure, are used to provide a further understanding of the disclosure. The illustrative embodiments of the disclosure and their descriptions are used to explain the disclosure, and do not constitute an improper limitation of the disclosure. In the attached drawings.

DETAILED DESCRIPTION OF THE EMBODIMENTS

Figure 1:
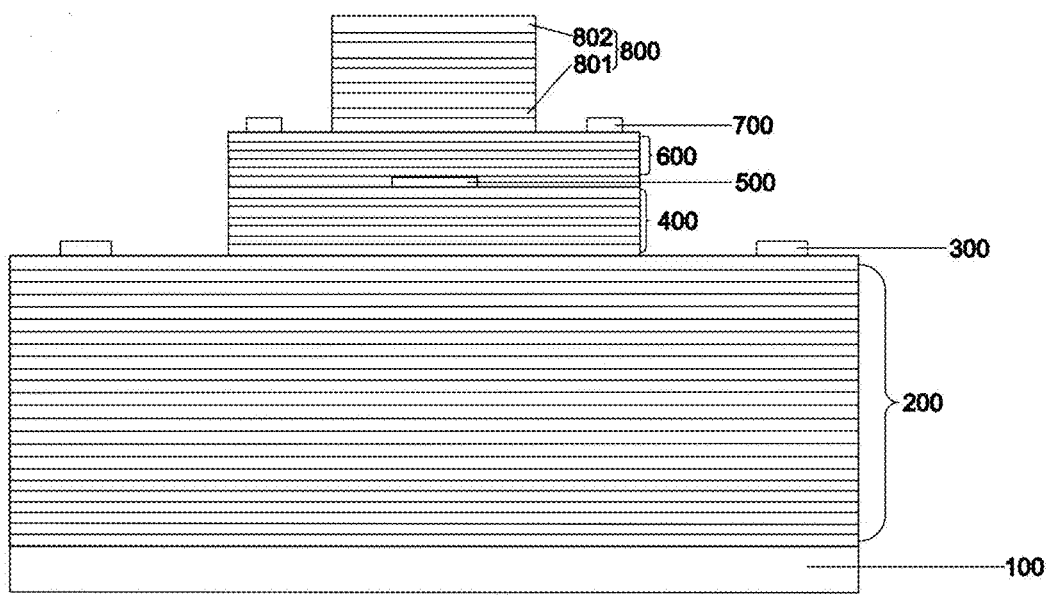
FIG. 1 is a schematic cross-sectional view of a laser structure according to an embodiment of the disclosure.

It should be noted that the embodiments in the disclosure and the features in the embodiments may be combined with each other without conflict. The present application will be described in detail with reference to the attached drawings and embodiments.

It should be noted that the steps shown in the flow chart of the accompanying drawings may be executed in a computer system such as a set of computer-executable instructions, and although the logical order is shown in the flow chart, in some cases, the steps shown or described may be executed in a different order from here.

In response to the shortcomings of the prior art, the disclosure provides a new vertical cavity surface emitting laser (VCSEL) structure. This structure is different from the conventional VCSEL in that in the disclosure, a second-class tunnel junction 500 is epitaxially grown and then photoetched into an elliptical aperture, and then an upper N-type DBR 600 is epitaxially grown and is combined with intra-cavity asymmetric electrodes of elliptical multi mesas and a mixed dielectric DBR 800 for the VCSEL structure. The elliptical second-class tunnel junction 500 may effectively realize the current limitation and optical field limitation of the device and improve the heat dissipation performance and output stability of the device. The second-class tunnel junction 500 is epitaxially grown and then photoetched to avoid a wet oxidation process and optimize the reliability and high modulation bandwidth performance of the device. The upper N-type DBR 600 is epitaxially grown after photoetching the second-class tunnel junction 500, so as to improve the luminous efficiency of the device. By combining the design of the intra-cavity electrodes of elliptical multi mesas and using asymmetric current injection, the heat dissipation capacity, carrier recombination efficiency and mode stability of the device are improved. High reflectivity, reduced device longitudinal size and improved optical feedback efficiency and improved output power of the device are achieved by the mixed dielectric DBR 800 consisting of $TiO_2/Si_3N_4$ materials with high and low refractive indexes.

The disclosure provides a new vertical cavity surface emitting laser structure, including epitaxially growing a second-class tunnel junction 500, and then photoetching the second-class tunnel junction 500 into an elliptical aperture. On the one hand, the tunneling capability of the second-class tunnel junction 500 is better than the tunneling capability of the first-class tunnel junction, so that the same tunneling current only needs less supply bias, that is, lower resistance, which effectively limits the current and optical field of the device. On the other hand, the process of wet oxidation is avoided, and the intrinsic capacitance of the device is lower than the intrinsic capacitance of the oxidation-limited VCSEL, so the reliability, thermal optimization ability and high bandwidth performance of the device are improved. The laser structure adopts a method of epitaxial growth of the upper N-type DBR 600 after photolithography, making the lateral flow of current in the N-doped upper DBR contribute less to the total resistance path, thus offsetting the current crowding and leading to a uniform lateral current distribution, and further improving the luminous efficiency of the device. The laser structure also adopts the design of intra-cavity electrodes of elliptical multi mesas, improving the heat dissipation capacity of the device and reducing the thermal impedance and optical loss of the Bragg reflector. However, this design may lead to current crowding at the edge of the aperture, resulting in higher loss, lower period bandwidth and limited single-mode operation. In order to improve the above shortcomings, the disclosure adopts the design of the intra-cavity electrodes of elliptical multi mesas, and meanwhile adopts the mode of asymmetric current injection, which reduces the phenomenon of carrier congestion, enables the injected holes and electrons to effectively recombine, and the current distribution is uniform, so that more current is injected into the active region 400, thereby improving the luminous efficiency and optical output power of the device, and also improving the heat dissipation capacity and polarization stability of the device, which is beneficial to the polarization of emitted light in the vertical current direction. The laser structure also combines the mixed dielectric DBR 800 composed of oxide $TiO_2$ and nitride $Si_3N_4$ materials with high and low refractive indexes. The material combination has high light emissivity, so the structure using this material combination may achieve the effect of high reflective mirror with less logarithm, thus reducing the size of the device and improving the output efficiency of the device.

To sum up, the disclosure provides a laser structure for VCSEL structure by epitaxially growing the second-class tunnel junction 500 and then continuing to epitaxially grow the upper N-type DBR 600, the intra-cavity electrodes of elliptical multi mesas and the mixed dielectric DBR 800 after photoetching, aiming at improving the reliability and high broadband modulation performance of a VCSEL device by using the second-class tunnel junction 500 with a non-oxidation photoetching aperture, improving the recombination efficiency of carriers and mode stability of the device by using the design of the intra-cavity asymmetric electrodes of elliptical multi mesas, and improving the output efficiency of the device and further improving the overall performance of the device by using the dielectric DBR of $TiO_2/Si_3N_4$ with high and low refractive indexes as an output mirror.

The above-mentioned laser structure according to the disclosure will be described with reference to the accompanying drawings.

As shown in FIG. 1, the device structure consists of a gallium arsenide (GaAs) substrate layer 100, a lower N-type DBR 200, negative electrodes 300 distributed on a first elliptical mesa, an active region 400, a second-class tunnel junction 500 and an upper N-type DBR 600, positive electrodes 700 distributed on a second elliptical mesa, and a mixed dielectric DBR 800 with a high refractive index from bottom to top. The second-class tunnel junction 500 is at the top of the active region 400, and the second-class tunnel junction 500 is surrounded by the upper N-type DBR 600. Intra-cavity asymmetric electrodes are composed of the negative electrodes 300 distributed on the first elliptical mesa and the positive electrodes 700 distributed on the second elliptical mesa. The negative electrodes 300 for injecting electrons are placed at both ends of a major axis of an elliptical mesa of the lower N-type DBR 200, and the positive electrodes 700 for injecting holes are placed at both ends of a minor axis of an elliptical mesa of the upper N-type DBR 600. The mixed dielectric DBR 800 is composed of periodically stacked dielectric thin films with high refractive index, and each layer of material participating in the stacking has an optical thickness of a quarter of a target wavelength. The second DBR 802 and the first DBR 801 are made of oxide $TiO_2$ with high refractive index and nitride $Si_3N_4$ with low refractive index, respectively, where the refractive index of the first DBR 801 is smaller than the refractive index of the second DBR 802. This structure improves the reliability of the device and the performance of the high modulation bandwidth, optimizes the current injection efficiency and polarization stability of the emitted light, improves the output efficiency, monochromaticity and spectral purity of the device, and further optimizes the performance of the device.

Figure 2:
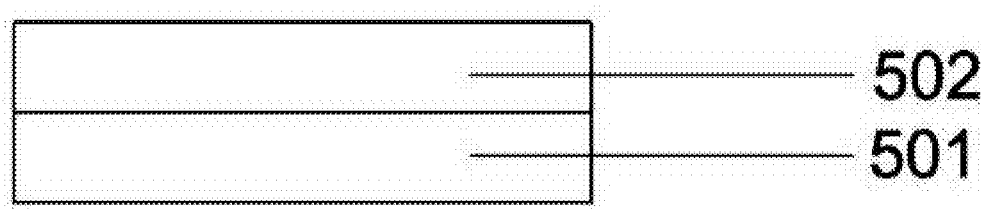
FIG. 2 is a schematic cross-sectional view of a second-class tunnel junction according to an embodiment of the disclosure.

As shown in FIG. 2, the bottom-up structure of the second-class tunnel junction is an N-type highly doped layer 501 and a P-type highly doped layer 502, whose material band gap may form the second-class tunnel junction and has GaAs lattice constant. The semiconductor material of the P-type highly doped layer 502 uses a doped material of aluminum (Al), gallium (Ga), arsenic (As) and antimony (Sb), and the semiconductor material of the N-type highly doped layer 501 uses a doped material of indium (In), gallium (Ga), arsenic (As) and phosphorus (P). The doping concentrations of the N-type highly doped layer 501 and the P-type highly doped layer 502 should be higher than $1\times10^{19}$ $cm^3$. The structure of the second-class tunnel junction effectively limits the electric field and optical field of the device.

Figure 3:
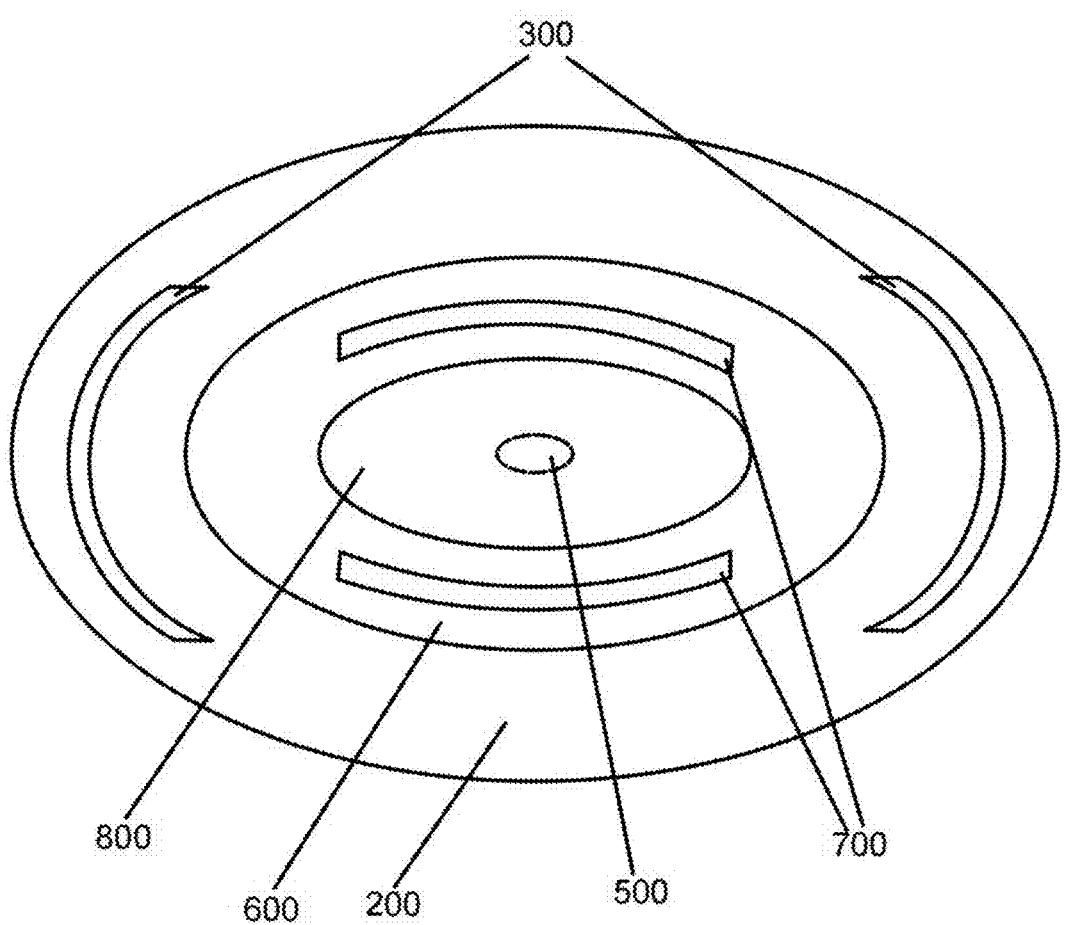
FIG. 3 is a schematic top view of a laser structure according to an embodiment of the disclosure.

As shown in FIG. 3, the overall structure of the device is an elliptical multi-mesa structure, where the substrate layer 100 and the lower N-type DBR 200 form a first elliptical cylinder, the active region 400 and the upper N-type DBR 600 form a second elliptical cylinder, and the mixed dielectric DBR 800 is a third elliptical cylinder. The first elliptical cylinder, the second elliptical cylinder and the third elliptical cylinder are designed as coaxial elliptical cylinders, and the structure optimizes the heat dissipation capacity of the device. The top mesa of the first elliptical cylinder is used as the first elliptical mesa, and shaded parts on the first elliptical mesa are the negative electrodes 300, and the top mesa of the second elliptical cylinder is used as the second elliptical mesa, and shaded parts of the second elliptical mesa are the positive electrodes 700. The dotted line in the figure is the second-class tunnel junction 500, which is surrounded by the upper N-type DBR 600. The second-class tunnel junction 500 is photoetched into the elliptical aperture after epitaxial growth, improving the heat dissipation performance and high bandwidth modulation performance of the device. Elliptical multi-mesa and intra-cavity asymmetric electrodes contribute to effective recombination of carriers and polarization stability, and optimize the luminous efficiency and mode stability of the device.

Figure 4:
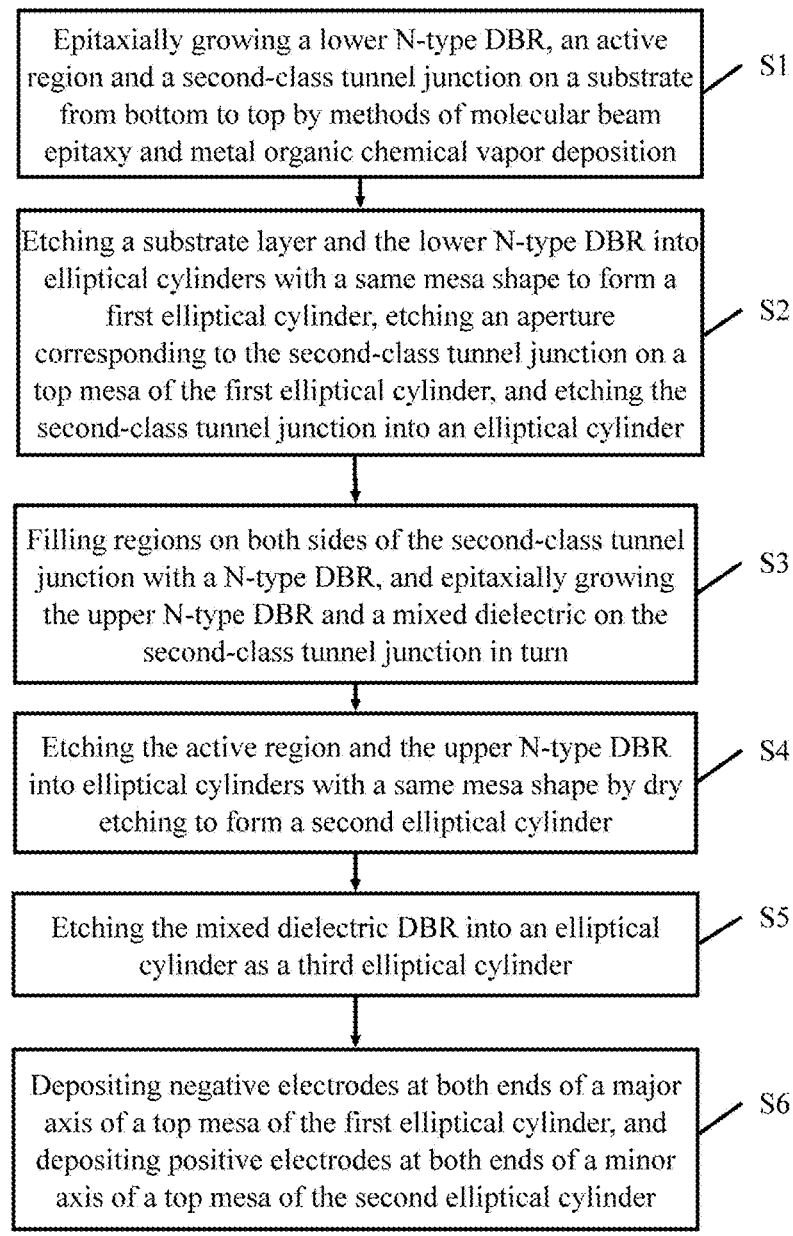
FIG. 4 is a flow chart of a manufacturing method of a vertical cavity surface emitting laser structure according to the disclosure.

In order to better achieve the above technical objectives, the disclosure also includes a manufacturing method of a new vertical cavity surface emitting laser, including following steps as shown in FIG. 4.

Firstly, by methods of molecular beam epitaxy (MBE) and metal organic chemical vapor deposition (MOCVD), a lower N-type DBR 200, an active region 400 and a second-class tunnel junction 500 are epitaxially grown on a GaAs substrate layer 100 from bottom to top, and then a first elliptical mesa and an aperture of the tiny elliptical second-class tunnel junction 500 are etched on the top of the lower N-type DBR 200. The specific method is: according to anisotropy of material etching rate and a numerical value of the etching rate in each direction, designing a direction with a faster etching rate as a minor axis of ellipse and a direction with a slower etching rate as a major axis of the ellipse by using dry etching, making the etching aperture obtain a better circular pattern. Elliptical mesa may not only optimize the heat dissipation structure and reduce the thermal effect, but also optimize the polarization of the device, enhance the mode stability, prevent mode hopping, and improve the beam quality and directivity. Among them, the function of limiting current and optical field is realized by using the second-class tunnel junction 500. At the same time, the current blocking region and aperture region are also determined by photolithography. Photolithography avoids the wet oxidation process and improves the reliability of the device.

Then, the N-type DBR is used to fill both sides of the second-class tunnel junction 500, and then an upper N-type DBR 600 and a mixed dielectric DBR 800 are epitaxially grown. The mixed dielectric DBR 800 is made of a material with a high refractive index of a second DBR 802, so an effect of high reflective mirror may be achieved by using less logarithm. Then, the active region 400 and the upper N-type DBR 600 are etched into elliptical columns by dry etching, thereby forming a second elliptical mesa, and the mixed dielectric DBR 800 continues to be etched into a third elliptical cylinder.

Finally, negative electrodes 300 are deposited on both ends of the major axis of the first elliptical mesa and positive electrodes 700 are deposited on both ends of the minor axis of the second elliptical mesa, thus forming intra-cavity asymmetric electrodes. Since the mobility of holes is less than the mobility of electrons, the above electrode structure may stabilize polarization and effectively recombine the injected holes and electrons, reduce the phenomenon of carrier congestion, and make the current distribution uniform, so that more current is injected into the active region 400, thereby improving the luminous efficiency, optical output power and mode stability of the device.

The disclosure provides a new vertical cavity surface emitting laser structure and a manufacturing method thereof. The new vertical cavity surface emitting laser is composed of elliptical multi mesas, an upper N-type DBR 600, a lower N-type DBR 200, an active region 400, a photoetched elliptical aperture after epitaxial growth of the second-class tunnel junction 500, a mixed dielectric DBR 800, intra-cavity asymmetric electrodes of elliptical mesas and other structures. A corresponding structure of the active region 400 may include a plurality of active regions 400, and is not limited to three but may also be four, five, etc. as an extension thereof, and the extension structure is formed by overlapping a plurality of active regions 400, and each active region 400 is formed by alternately stacking a plurality of pairs of quantum wells and well barriers. In the elliptical multi-mesa structure, the elliptical mesas are not limited to two, but the structure may also be a multi-mesa structure having three, four, etc. larger than one elliptical mesa. The multi-mesa structure is formed by an etching process, and multiple mesas are formed by multiple etching processes. The closer to the upper end, the better the small mesa, and the closer to the lower end, the better the large mesa. Therefore, the mesas with different sizes may be etched for many times, which may better balance the parasitic performance and thermal performance.

The above are only the preferred embodiments of the disclosure, but the protection scope of the disclosure is not limited to this. Any change or replacement that may be easily thought of by a person familiar with this technical field within the technical scope disclosed in the disclosure should be included in the protection scope of the disclosure. Therefore, the protection scope of the disclosure should be based on the protection scope of the claims.

What is claimed is:

1. A vertical cavity surface emitting laser structure, comprising:
a substrate layer, a lower N-type DBR, an active region, an upper N-type DBR and a mixed dielectric DBR sequentially arranged from bottom to top, wherein a second-class tunnel junction is arranged on one side of the active region close to the upper N-type DBR, wherein the second-class tunnel junction is embedded in a bottom of the upper N-type DBR and surrounded by the upper N-type DBR, and the substrate layer, the lower N-type DBR, the active region, the upper N-type DBR, the mixed dielectric DBR and the second-class tunnel junction are all coaxial elliptical cylinders; negative electrodes are arranged on the lower N-type DBR, and positive electrodes are arranged on the upper N-type DBR;

mesa shapes of the substrate layer and the lower N-type DBR are same to form a first elliptical cylinder; mesa shapes of the active region and the upper N-type DBR are same to form a second elliptical cylinder; the mixed dielectric DBR is used as a third elliptical cylinder, wherein proportions of major and minor axes of the first elliptical cylinder, the second elliptical cylinder and the third elliptical cylinder are same, and mesa areas are reduced in turn; the negative electrodes are symmetrically arranged at both ends of a major axis of a top mesa of the first elliptical cylinder, and the positive electrodes are symmetrically arranged at both ends of a minor axis of a top mesa of the second elliptical cylinder.

2. The structure according to claim 1, wherein
the mixed dielectric DBR comprises first DBRs and second DBRs provided in alternating stacks, wherein a refractive index of the first DBRs is smaller than the second DBRs, and the first DBRs and the second DBRs each have an optical thickness of a quarter of a target wavelength, and the second DBRs and the first DBRs respectively use oxide $TiO_2$ and nitride $Si_3N_4$, wherein the second DBRs are arranged in contact with the upper N-type DBR.

3. The structure according to claim 1, wherein
the second-class tunnel junction comprises an N-type highly doped layer and a P-type highly doped layer sequentially arranged, wherein the N-type highly doped layer is arranged in contact with the active region.

4. The structure according to claim 3, wherein
a semiconductor material of the N-type highly doped layer uses a doped material of aluminum, gallium, arsenic and antimony.

5. The structure according to claim 3, wherein
a semiconductor material of the P-type highly doped layer uses a doped material of indium, gallium, arsenic and phosphorus.

6. A manufacturing method of the vertical cavity surface emitting laser structure according to claim 1, wherein
epitaxially growing the lower N-type DBR, the active region and the second-class tunnel junction on the substrate from bottom to top by methods of molecular beam epitaxy and metal organic chemical vapor deposition;

etching the substrate layer and the lower N-type DBR into elliptical cylinders with a same mesa shape to form the first elliptical cylinder, etching an aperture corresponding to the second-class tunnel junction on the top mesa of the first elliptical cylinder, and etching the second-class tunnel junction into an elliptical cylinder;

filling regions on both sides of the second-class tunnel junction with an N-type DBR, and epitaxially growing the upper N-type DBR and a mixed dielectric on the second-class tunnel junction in turn;

etching the active region and the upper N-type DBR into elliptical cylinders with a same mesa shape by dry etching to form the second elliptical cylinder;

etching the mixed dielectric DBR into an elliptical cylinder as the third elliptical cylinder;

wherein the proportions of the major and minor axes of the first elliptical cylinder, the second elliptical cylinder and the third elliptical cylinder are same, and the mesa areas are reduced in turn; and depositing the negative electrodes at the both ends of the major axis of the top mesa of the first elliptical cylinder, and depositing the positive electrodes at the both ends of the minor axis of the top mesa of the second elliptical cylinder.

\* \* \* \* \*